METHOD OF MAKING FIELD EFFECT TRANSISTOR DEVICE

Filed April 19, 1965

INVENTOR.
OWEN W. HATCHER

BY Flehr and Swain

ATTORNEYS

United States Patent Office 3,340,598

Patented Sept. 12, 1967

3,340,598

METHOD OF MAKING FIELD EFFECT TRANSISTOR DEVICE

Owen W. Hatcher, Sunnyvale, Calif., assignor, by mesne assignments, to Teledyne, Inc., Hawthorne, Calif., a corporation of Delaware Filed Apr. 19, 1965, Ser. No. 448,953

5 Claims. (Cl. 29—571)

The present invention is directed to a method of making a field effect transistor device and more particularly to a method of making complementary field effect devices having channels of opposite conductivity types in the same semiconductor substrate.

In many applications it is desirable to provide complementary type devices in a common layer or substrate of an integrated circuit. However, since complementary devices are by definition of opposite type conductivities for corresponding components, the conductivity type of the semiconductive substrate matches only that of one of the complementary devices. As a consequence, a region of the opposite conductivity must be provided within the base substrate for the other complementary device. This leads to problems in the control of impurity concentrations.

Impurity concentrations are especially critical in field effect devices having metal over oxide gate structures. In these devices a relatively lightly doped region is required under the gate electrode to provide inversion of conductivity of the channel to initiate conduction between the source and drain.

It is a general object of the present invention to provide an improved method of making field effect transistors.

It is another object of the invention to provide a method of making a field effect transistor in which the impurity concentrations are accurately controlled.

It is yet another object of the invention to provide an improved method of making complementary field effect transistors in the same semiconductive substrate.

It is still another object of the invention to provide an improved method of making a field effect transistor of the metal over oxide gate type.

These and other objects and features of the invention will be apparent from the accompanying drawings and the following description.

Referring to the drawing:

FIGURES 2–7 are partial views showing the steps in the novel process of the invention in making a device of the type shown in FIGURE 1;

Figure 2:
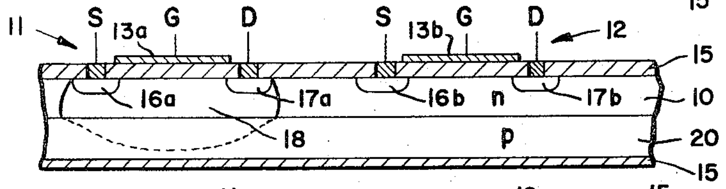
FIGURE 2 is a cross-sectional view taken along the line 2—2 of FIGURE 1.
Figures 1, 8:
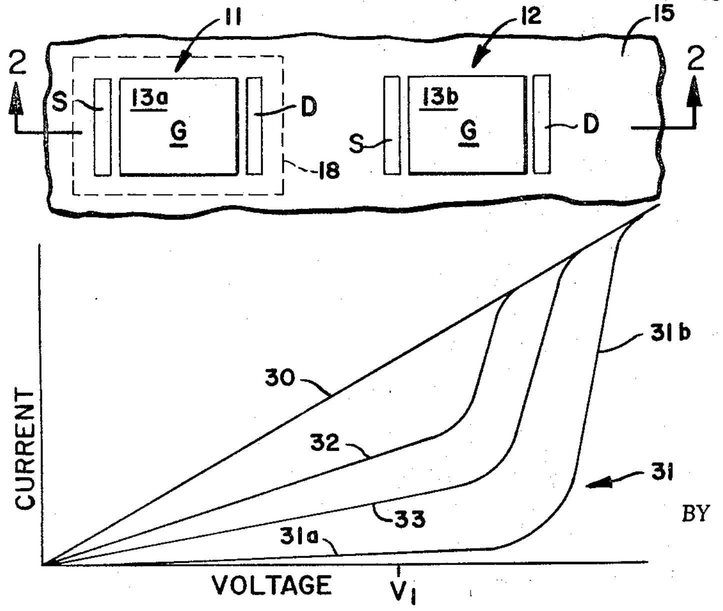
FIGURE 1 is a plan view of a device constructed in accordance with the novel process of the present invention.
FIGURE 8 is a graph useful in understanding the invention.

FIGURES 1 and 2 show a semiconductive layer 10 containing complementary field effect transistors 11 and 12 of the metal over oxide gate type. The transistors include source S, drain D, and gate G ohmic connections on one surface making connection to the underlying material. The complementary transistors include metal layers 13*a* and 13*b* extending between the respective source S and drain D zones of transistors 11 and 12. The gate connections overlie an insulating layer 15, for example silicon oxide, which separates the conductive metal layer from layer 10.

The source and drain regions comprise inset zones 16*a* and 17*a* for transistor 11, and 16*b* and 17*b* for transistor 12. In the case of transistor device 12, zones 16*b* and 17*b* are of opposite conductivity type to semiconductive layer 10, and for transistor device 11, the corresponding zones are of the same conductivity type. However, zones 16*a* and 17*a* are almost totally enveloped by a zone 18 of opposite conductivity type to the source and drain zones.

In operation, the metal over oxide gate type transistor device normally provides an open circuit between the source and drain since the "channel" between these respective zones is of a conductivity type opposite that of the source and drain regions; therefore at least one rectifying junction is set up. However, the application of a voltage to the gating layer 13 causes, in effect, a conductivity inversion of the "channel" so that the source and drain channel regions now are of a common conductivity type to provide for the transmission of carriers along the inversion layer.

As a result of the mode of operation of the metal over oxide gate type field effect transistor, it is imperative that the channel between the source and drain zones have a relatively low impurity concentration in order to provide for efficient conductivity inversion of this channel. In the case of transistor device 12, the original layer 10 can easily be initially made with such an impurity concentration. However, where a complementary device is added to the same semiconductive layer, an added diffusion must be used to provide a semiconductive zone of the opposite conductivity type.

In accordance with the present invention, there is provided a process for accurate control of this diffusion to provide the low impurity concentration zone which is necessary.

Figure 3:
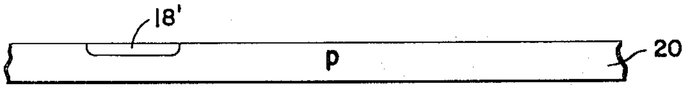
Figure 4:
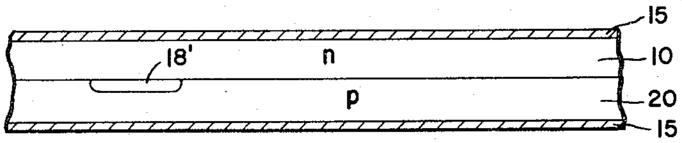
Figure 5:
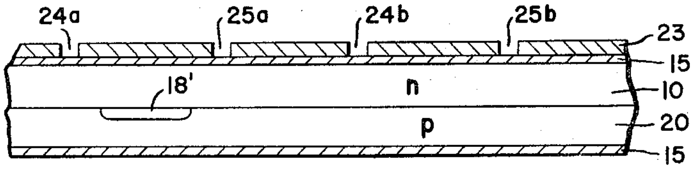

Referring now to FIGURES 2–7, the steps of forming a device having such a zone are illustrated. Initially, a semiconductive substrate 20, which may be of p-type semiconductive material, FIGURE 3, is lapped to provide a flat upper surface. After proper masking (not shown), a predeposit of p-type or acceptor material 18′, such as boron, is provided on a selected area of the upper surface of substrate 20 by heating the substrate in an impurity containing atmosphere. This deposit is of a high impurity concentration since, in the later steps of the method, it will be diffused to form zone 18. Next, as shown in FIGURE 4, a semiconductive layer 10, which may be of n-type conductivity, is grown on layer 20, as for example, by epitaxial growth, and is in contiguous relationship thereto. After the above growth, an oxide layer 15 is also provided on the top and bottom surfaces of structure 20, 10. With the addition of epitaxial layer 10, the predeposit 18′ is buried within the semiconductive structure.

Source and drain zones for complementary field effect transistors 11 and 12 are formed by predeposition of impurities on the portions of layer 10 which are exposed by windows formed in the oxide layer 15, and by then diffusing these impurities inwardly. In preparation for this step, a photoresist 23 is applied to oxide layer 15 and thereafter masked, exposed to light, and washed to form windows 24*a* and 25*a*, which are substantially juxtaposed over region 18′, and windows 24*b* and 25*b*, which are remote from the first pair of windows. The structure is then immersed in a suitable acid etching bath which selectively attacks the exposed portions of the oxide layer 15 to uncover the surface of layer 10. However, the etching and predeposition is done in successive steps; windows 24*a* and 25*a* are first etched and a donor type impurity predeposited, and thereafter windows 24*b* and 25*b* are etched and an acceptor type impurity predeposited.

Figure 6:
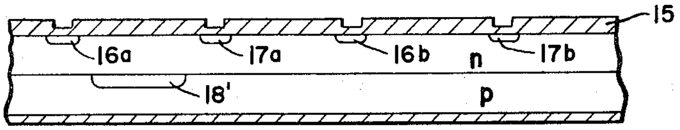

FIGURE 6 illustrates predeposited donor regions 16*a* and 17*a* and acceptor regions 16*b* and 17*b* which, when fully diffused, will serve as the source and drain regions for transistors 11 and 12 respectively.

Figure 7:
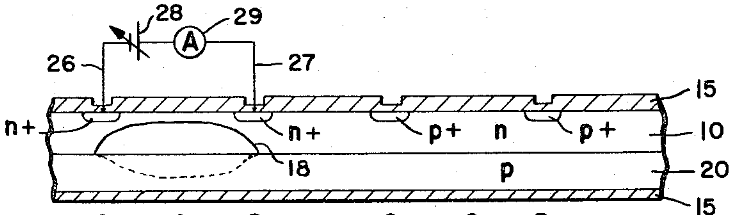

As shown in FIGURE 7, all of the predeposited regions, including region 18', are diffused by elevating the temperature of the wafer. Region 18' is illustrated as only partially diffused through the layer 10 toward the surface of such layer. Since the source and drain regions 16*a* and 17*a* were initially juxtaposed above this region, the diffusion will eventually encompass these to provide, as shown in FIGURE 2, a channel region of p-type conductivity between the n-type source and drain zones 16*a* and 17*a*. Because of the relatively higher impurity concentration of the source and drain zones, their n-type conductivity is maintained when encompassed by the low impurity concentration p-type diffusion. This diffusion must be stopped at substantially the point at which it reaches the top surface of layer 10 in order to provide the necessary low impurity concentration which is desirable in the operation of a metal over oxide gate type field effect device as discussed above.

In order to accomplish this end, the diffusion is monitored by placing a pair of probes 26 and 27 into regions 16*a* and 17*a*. The probes are series connected with a unipotential variable voltage source 28 and an ammeter 29.

The variation of current, as voltage is varied during different stages of the diffusion process, is depicted in FIGURE 8. More specifically the probes will see initially, when there has been little or no diffusion of zone 18, a pure resistance as illustrated by curve 30 since the regions 16*a* and 17*a* are connected by a channel of the same conductivity type themselves. When diffusion has fully progressed, as shown in FIGURE 2, zone 18 will have completely eliminated any type of resistive action and a diode action will exist at the junction of either the source or drain zone, depending on the polarity of the unipotential source 28. Curve 31 illustrates such diode action; the curve indicates the back voltage characteristic of the diode that is formed. The horizontal portion 31*a* of the curve shows the diode effectively blocking the passage of current and portion 31*b*, showing a rapidly rising current, occurs when sufficient voltage is applied to produce zener breakdown. Naturally, the maximum current possible is limited by the resistance characteristic curve 30. Curves 32 and 33 illustrate intermediate steps of diffusion when the action is partially resistive and partially rectifying. Thus, the diffusion may be monitored and stopped when the condition of curve 31 is achieved.

The meter arrangement can easily be converted to a production type system with a "go" "no go" characteristic since at a given voltage, for example $V_1$, the current will be at an almost zero level only when substantially complete diode action is achieved.

After the diffusion of zone 18, the complementary field effect devices are completed by the provisions of source and drain connections and the gate connections which are provided by conductive layers 13*a* and 13*b* which are applied in a manner well known in the art.

Thus, the present invention provides a process for the manufacture of field effect transistors whereby the impurity concentration of the channel is precisely controlled. Moreover, the process is especially useful in thep roduction of complementary field effect devices of the metal over oxide gate type.

I claim:

1. A process for forming a field effect transistor of the type described comprising: providing a semiconductive substrate of one conductivity type; depositing on a selected area of one surface of said substrate a high impurity concentration region of said one conductivity type; placing a semiconductive layer of opposite conductivity type in contiguous relationship with said surface to form a rectifying junction therewith; depositing on the surface of said semiconductive layer in substantial juxtaposition with said selected area a pair of spaced semiconductive regions of said opposite conductivity type; diffusing said high impurity concentration region into said semiconductive layer toward said surface of said layer; monitoring said diffusion by placing a voltage across said spaced pair of regions; and stopping such diffusion when said monitoring indicates a substantial diode action between one of said spaced regions and said semiconductive layer.

2. A process as in claim 1 in which said monitoring is accomplished by a pair of probes connected to said spaced pair of regions.

3. A process for forming complementary field effect transistors in the same semiconductive layer comprising the following steps: providing a semiconductive substrate of one conductivity type; depositing an a selected area of one surface of said substrate a high impurity concentration region of said one conductivity type; placing a semiconductive layer of opposite conductivity type in contiguous relationship with said surface to form a rectifying junction therewith; depositing on the surface of said semiconductive layer in substantial juxtaposition with said selected area a first pair of spaced regions of said opposite conductivity type; depositing on the surface of said semiconductive layer in a location spaced from said first pair of regions, a second pair of spaced regions of said one conductivity type; diffusing said high impurity concentration into said semiconductive layer toward said surface of said layer; monitoring such diffusion by placing a voltage across said first pair of spaced regions; and stopping said diffusion when said monitoring indicates a substantial diode action between one of said first pair of spaced regions and said semiconductive layer.

4. A process for forming complementary field effect transistors in the same semiconductive layer comprising the following steps: providing a semiconductive substrate of one conductivity type; depositing on a selected area of one surface of said substrate a high impurity concentration region of said one conductivity type; placing a semiconductive layer of opposite conductivity type in contiguous relationship with said surface to form a rectifying junction therewith; depositing on the surface of said semiconductive layer in substantial juxtaposition with said selected area a first pair of spaced regions of said opposite conductivity type; depositing on the surface of said semiconductive layer in a location spaced from said first pair of regions, a second pair of spaced regions of said one conductivity type; diffusing said high impurity concentration region into said semiconductive layer toward said surface of said layer; monitoring such diffusion by placing a voltage across said first pair of spaced regions; stopping said diffusion when said monitoring indicates a substantial diode action between one of said first pair of spaced regions and said semiconductive layer; providing an insulating layer overlying said surface of said semiconductive layer; placing two spaced conductive layers on said insulating layer, one of said conductive layers extending between said first pair of spaced regions and at least partially overlying such regions, and the other conductive layer extending between said second pair of spaced regions and at least partially overlying such regions, such conductive layers providing the gating action for the field effect devices; providing ohmic source and drain connections to each of said pairs of spaced regions and gate connections to each of said conductive layers.

5. A process for forming complementary field effect transistors in the same semiconductive layer comprising the following steps: providing a semiconductive substrate of one conductivity type; depositing on a selected area of one surface of said substrate a high impurity concentration region of said one conductivity type; growing an epitaxial layer of an opposite conductivity type on said surface of said layer; depositing on the surface of said epitaxial layer in substantial juxtaposition with said selected area a first pair of spaced regions having high impurity concentrations of said opposite conductivity type; depositing on said epitaxial layer surface a second pair of spaced regions having high impurity concentrations of said one conductivity type in a location remote from said first pair; heating said above structure to diffuse said high concentration region of said one conductivity type into said epitaxial layer; monitoring such diffusion by placing a voltage across said first pair of spaced regions and detecting the amount of current flow; and stopping said diffusion when said current flow is reduced a predetermined amount to indicate substantial diode action between one of said first pair of spaced regions and said epitaxial layer.

No references cited.

WILLIAM I. BROOKS, *Primary Examiner.*